US 6,699,776 B2

(12) United States Patent
Matsuoka et al.

(10) Patent No.: US 6,699,776 B2
(45) Date of Patent: Mar. 2, 2004

(54) MOSFET GATE INSULATING FILM AND METHOD OF MANUFACTURING THE SAME

(75) Inventors: Fumitomo Matsuoka, Kawasaki (JP); Minoru Takahashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 18 days.

(21) Appl. No.: 09/985,340

(22) Filed: Nov. 2, 2001

(65) Prior Publication Data

US 2002/0025633 A1 Feb. 28, 2002

Related U.S. Application Data

(62) Division of application No. 09/468,315, filed on Dec. 21, 1999, now Pat. No. 6,333,541.

(30) Foreign Application Priority Data

Dec. 22, 1998 (JP) ............................................. 10-363710

(51) Int. Cl.⁷ .................. H01L 21/3205; H01L 21/336; H01L 21/8238; H01L 21/8234
(52) U.S. Cl. ..................... 438/585; 438/197; 438/199; 438/218; 438/275; 438/287
(58) Field of Search ................................ 438/199, 217, 438/276, 197, 289, 291, 275, 287, 585, 587, 588, 216, 218

(56) References Cited

U.S. PATENT DOCUMENTS

| 4,849,366 | A | * | 7/1989 | Hsu et al. ..................... 438/216 |
| 5,600,164 | A | | 2/1997 | Ajika et al. |
| 5,672,521 | A | | 9/1997 | Barsan et al. |
| 5,674,788 | A | | 10/1997 | Wristers et al. |
| 5,960,289 | A | | 9/1999 | Tsui et al. |
| 5,963,803 | A | | 10/1999 | Dawson et al. |
| 6,027,961 | A | | 2/2000 | Maiti et al. |
| 6,075,273 | A | | 6/2000 | Liu |
| 6,171,910 | B1 | * | 1/2001 | Hobbs et al. ............... 438/275 |

FOREIGN PATENT DOCUMENTS

| JP | 01-257366 A | | 10/1989 |
| JP | 05-121699 A | | 5/1993 |
| JP | 06-224413 A | | 8/1994 |
| JP | 07-297298 A | | 11/1995 |
| JP | 09-92729 A | | 4/1997 |
| JP | 09092729 | * | 4/1997 |
| JP | 10-163337 A | | 6/1998 |
| JP | 10-313114 A | | 11/1998 |
| KR | 93-22589 A | | 11/1993 |

OTHER PUBLICATIONS

KR Office Action from KR Appln. 10–1999–0060125 dated Jun. 24, 2002 (w/English translation).
Okayama et al., "Nitrogen Concentration Optimization for Down–scaled CMOSFET with $N_2O$–based Oxynitride Process," Symposium on VSLI Technology, Digest of Technical Papers,, 1998, pp. 220–221.
Bhat et al., Recent Developments in $N_2O$– and NO–based Oxynitride Dielectrics for CMOS ULSI Applications, Electron Devices and Materials Symposium, 1994, pp. 1–1–1 to 1–1–4.
Sodini et al., "Silicon Oxynitride Gate Dielectrics for Scaled CMOS," Electron Devices Meeting Dec. 13–16, Technical Digest, International, 1992, pp. 25.1.1 to 25.1.4.

* cited by examiner

*Primary Examiner*—Caridad Everhart
*Assistant Examiner*—Chuong A Luu
(74) *Attorney, Agent, or Firm*—Banner & Witcoff, Ltd.

(57) ABSTRACT

A semiconductor device where an interface circuit operating on a high power supply voltage and exchanging signals and data with an external device and an internal circuit operating on a low power supply voltage are integrated in a single chip. The interface circuit includes a transistor whose gate insulating film is made of $SiO_2$. The internal circuit includes a transistor whose gate insulating film is made of an oxynitride film of nitrogen-added $SiO_2$. Boron or $BF_2$ has been introduced into the gate electrodes of the p-channel transistors among those whose gate insulating films have been made of an oxynitride film.

7 Claims, 3 Drawing Sheets

MOSFET GATE INSULATING FILM AND METHOD OF MANUFACTURING THE SAME

CROSS REFERENCE TO RELATED APPLICATIONS

This application is a divisional of U.S. Ser. No. 09/468,315, filed Dec. 21, 1999 now U.S. Pat. No. 6,335,541B1 which claims priority under 35 U.S.C. §119 to Japanese Patent Application No. 10-363710, filed Dec. 22, 1998, the entire contents of which are incorporated herein by reference.

BACKGROUND OF THE INVENTION

This invention relates to a semiconductor device and a method of manufacturing the same, and more particularly to a MOSFET gate insulating film in a semiconductor device using two types of power supply voltage in a single chip and a method of manufacturing the same.

As integrated circuits are being required to operate much faster, the gate electrode length of a MOSFET grows finer at an increasingly rapid pace. By 2000, the advent of an integrated circuit using MOSFETs with a gate electrode length on the order of about 0.15 μm to 0.1 μm is expected. In such a fine MOSFET, it is expected that the power supply voltage to bring out the optimum performance might more frequently differ from the power supply voltage determined by the interface with another device on the outside. For example, this corresponds to the following case: use of a power supply voltage of 2.5V is preferable to the interface with an external device, whereas use of a power supply voltage of about 1.8V is preferable to operating the relevant integrated circuit at high speed.

Another problem in miniaturizing MOSFETs arises from making the gate insulating film thinner. Specifically, the gate insulating film must be made thinner as the gate electrode length grows finer. In this case, when the electric field applied to the thin gate insulating film has reached 5 MV/cm or higher, the insulating film is more liable to be broken, decreasing the reliability.

For this reason, a semiconductor device required to operate at higher speed has employed such a structure including MOSFETs with different gate insulating films formed in a single chip and selectively using the MOSFETs with the gate insulating film thickness suitable for each power supply voltage.

Still another problem in making the gate insulating film thinner arises from: when p-type polysilicon is used for the gate electrode of a p-channel MOSFET with a fine gate length, p-type impurities, such as boron, included in the polysilicon pass through the thinner gate insulating film in various thermal processes carried out in the manufacturing processes and diffuse throughout the substrate, which degrades the controllability of the threshold voltage. It is known that use of material including a trace of nitrogen for the gate insulating film is effective in dealing with the problem. For example, it is desirable that oxynitride should be used for a gate insulating film whose thickness is 6 nm or less.

Next, using FIG. 1 and FIGS. 2A to 2D, a conventional semiconductor device and a method of manufacturing the semiconductor device will be explained.

As shown in FIG. 1, element isolating regions 12 have been formed at the main surface of a silicon (Si) substrate 11. In the element regions electrically separated by the element isolating regions 12, diffused layers 13 and 14 acting as source/drain regions are formed. A gate insulating film 15 is formed on the silicon substrate 11 between the source/drain regions 13. On the gate insulating film 15, a gate electrode 16 is formed, thereby constructing a MOSFET Q1. A gate insulating film 17 is formed on the silicon substrate 11 between the source/drain regions 14. A gate electrode 18 is formed on the gate insulating film 17, thereby constructing a MOSFET Q2.

The MOSFET Q1 constitutes an internal circuit. In the p-channel MOSFET in area A in which the MOSFET Q1 has been formed, p-type material, such as boron-doped polysilicon, is used for the gate electrode 16. In contrast, the MOSFET Q2 formed in area B constitutes a circuit for exchanging signals and data with an external device. The MOSFET Q1 formed in area A operates on about 1.8V lower than MOSFET Q2 formed in area B and the dimension (gate length) of, for example, the gate electrode is 180 nm. In the MOSFET Q1, the gate insulating film 15 requires a thickness of about 4 nm to provide the optimum performance. In contrast, because an external power supply voltage of 2.5V is applied to the MOSFET Q2 formed in area B, the gate insulating film 17 needs a thickness of about 6 nm. An oxynitride film is used as the gate insulating films 15 and 17.

The semiconductor device of FIG. 1 is formed by the processes shown in FIGS. 2A to 2D. First, as shown in FIG. 2A, element isolating regions 12 are formed in a silicon substrate 11. Then, impurities for controlling the threshold voltage of a MOSFET are introduced into the main surface of the silicon substrate 11.

Thereafter, as shown in FIG. 2B, to become a gate insulating film 17, oxynitride is deposited on the main surface of the silicon substrate 11. The oxynitride film has a thickness of, for example, about 5 nm. Following that, a resist pattern 19 is formed as a mask on the oxynitride film 17 in area B by, for example, photoetching techniques.

Next, after the oxynitride film 17 on area A has been removed, another oxynitride layer is deposited as a gate insulating film 15 to a thickness of, for example, 4 nm. In this case, the oxynitride film 17 on area B is subjected to another oxidation, which forms a gate insulating film 17 of about 6 nm in thickness (see FIG. 2C).

Thereafter, as shown in FIG. 2D, polysilicon 20 is deposited on the gate insulating films 15 and 17 to a thickness of, for example, about 200 nm. The polysilicon film is patterned by photoetching techniques, thereby forming gate electrodes 16 and 18.

Then, impurity ions are implanted into the silicon substrate 11. The resulting silicon substrate is then activated by rapid thermal annealing at about 1000□, thereby forming a diffused layer to act as the source/drain regions 13 and 14 of each of the MOSFETs Q1 and Q2. This completes a semiconductor device as shown in FIG. 1.

In the semiconductor device formed as described above, use of an oxynitride film for the internal circuit MOSFET Q1 using the gate insulating film as thin as about 4 nm prevents p-type impurities from diffusing from the gate electrode 16 into the silicon substrate 11. In the manufacturing processes, however, the MOSFET Q2 interfacing with an external device using the gate insulating film 17 as thick as about 6 nm has also a structure using an oxynitride film. In heat treatment at about 1000□, the gate insulating film of about 6 nm in thickness does not necessarily need oxynitride from the viewpoint of the diffusion of p-type impurities from the gate electrode 18 into the silicon substrate 11. Conversely, use of oxynitride causes the problem of decreasing the current driving capability of the MOSFET Q2 due to the appearance of an interface level. Therefore, use of oxynitride is unfavorable from the standpoint of making the operation speed of the semiconductor device faster.

In the conventional semiconductor device and the method of manufacturing the semiconductor device, since an oxynitride film has been used as all the gate insulating films in an LSI requiring two or more types of power supply, this has caused the problems of decreasing the current driving capability and operation speed of the MOSFET.

BRIEF SUMMARY OF THE INVENTION

A first embodiment of the present invention is to provide a semiconductor device capable of not only minimizing a decrease in the current driving capability of a MOSFET but also making its operation speed faster in an LSI requiring two or more types of power supply.

A second embodiment of the present invention is to provide a method of manufacturing a semiconductor device capable of not only minimizing a decrease in the current driving capability of a MOSFET but also making its operation speed faster in an LSI requiring two or more types of power supply.

The first object of the invention is accomplished by providing a semiconductor device comprising: a first circuit which is integrated in a semiconductor chip and operates on a first voltage and which includes a transistor whose gate insulating film is made of $SiO_2$; and a second circuit which is integrated in the semiconductor chip and operates on a second voltage lower than the first voltage and which includes a transistor whose gate insulating film is made of an oxynitride film of nitrogen-added $SiO_2$, wherein the gate electrodes of the p-channel transistors among the transistors are made of a p-type conductivity material.

It is preferable that the gate insulating film used in the transistor constituting the first circuit has a thickness of 5 nm or more and the gate insulating film of the transistor constituting the second circuit has a thickness of less than 5 nm.

Furthermore, the first object of the invention is accomplished by providing a semiconductor device integrated in a single chip and operating on a first and a second power supply voltage, comprising: an interface circuit which operates on the first power supply voltage and exchanges signals and data with an external device and which includes a transistor whose gate insulating film is made of $SiO_2$; and an internal circuit which operates on a second power supply voltage lower than the first power supply voltage and which includes a transistor whose gate insulating film is made of an oxynitride film nitrogen-added $SiO_2$, wherein the gate electrodes of the p-channel transistors among the transistors are made of a p-type conductivity material.

The semiconductor device preferably has the following characteristics:

(a) The gate insulating film used in the transistor constituting the interface circuit has a thickness of 5 nm or more and the gate insulating film of the transistor constituting the internal circuit has a thickness of less than 5 nm.

(b) Each of the gate electrodes of the transistor in the interface circuit and the transistor in the internal circuit includes at least one of polysilicon, a stacked structure of polysilicon and silicide, a stacked structure of polysilicon and metal, a stacked structure of polysilicon and TiN, and a stacked structure of polysilicon, metal, and TiN.

(c) The p-type conductivity material included in the gate electrode of the p-channel transistor includes either boron or $BF_2$.

(d) The concentration of nitrogen included in the oxynitride film is preferably 1.3 atm % or less, when the p-type conductivity material included in the gate electrode of the p-channel transistor is boron.

(e) The concentration of nitrogen included in the oxynitride film is preferably 1.2 atm % or less, when the p-type conductivity material included in the gate electrode of the p-channel transistor is $BF_2$.

With the above configuration, because a pure oxide film ($SiO_2$) is used for a MOSFET operating on a high voltage and requiring a thick gate insulating film and an oxynitride film is used for a MOSFET operating on a low voltage and requiring a thin gate insulating film, the characteristic of, for example, not only the MOSFET constituting the first circuit (interface circuit) to which an external power supply voltage is directly applied is prevented from deteriorating because of the influence of nitrogen, but the problem of penetration of boron through, for example, the MOSFET constituting the second circuit (internal circuit) to which the internal power supply voltage is applied is avoided. This makes it possible to minimize a decrease in the current driving capability of the MOSFET and make the operation speed faster in an LSI requiring two types of power supply.

When the gate insulating film used in the MOSFET constituting the first circuit is formed thicker than 5 nm and the gate insulating film of the MOSFET constituting the second circuit is formed thinner than 5 nm, this suppresses the problem of deterioration of the characteristic because of the influence of nitrogen and the problem of penetration of boron more effectively.

The second object of the invention is accomplished by providing a method of manufacturing a semiconductor device where a first circuit operating on a first voltage and a second circuit operating on a second voltage lower than the first voltage are formed in a single chip and a p-type conductivity material is used for the gate electrode of a p-channel transistor constituting the second circuit, comprising: the step of forming an oxynitride film of nitrogen-added $SiO_2$ as the gate insulating film of a transistor constituting the second circuit; the step of forming the gate electrode material layer of the transistor constituting the second circuit on the oxynitride film; the step of forming an $SiO_2$ film as the gate insulating film of a transistor constituting the first circuit; and the step of forming a gate electrode material layer for the transistor constituting the first circuit on the gate insulating film, wherein the gate insulating film and gate electrode material layer of the transistor constituting the first circuit are formed in processes different from those in which the gate insulating film and gate electrode material layer of the transistor constituting the second circuit are formed.

The method preferably has the following characteristics:

(f) The gate insulating film of the transistor constituting the first circuit has a thickness of 5 nm or more and the gate insulating film of the transistor constituting the second circuit has a thickness of less than 5 nm.

(g) The method further comprises the step of patterning the gate electrode material layer of the transistor constituting the first circuit and the gate electrode material layer of the transistor constituting the second circuit by using a single mask, wherein the gate electrode of the transistor constituting the first circuit and the gate electrode of the transistor constituting the second circuit are processed simultaneously.

Furthermore, the second object of the invention is accomplished by providing a method of manufacturing a semiconductor device with an interface circuit operating on a first power supply voltage and exchanging signals and data with an external device, and an internal circuit operating on a second power supply voltage lower than the first power supply voltage, comprising: the step of forming an oxynitride film of nitrogen-added $SiO_2$ as the gate insulating film of the transistor constituting the internal circuit on the main surface of a semiconductor substrate; the step of forming a first gate electrode material layer of the transistor constituting the internal circuit on the oxynitride film; the step of forming a mask on an area in which the internal circuit is to be formed and removing the oxynitride film and the first gate electrode material layer in an area in which the interface circuit is to be formed to expose the main surface of the semiconductor substrate; the step of forming an $SiO_2$ film as the gate insulating film of the transistor constituting the interface circuit on the main surface of the exposed semiconductor substrate; the step of forming a second gate electrode material layer of the transistor constituting the interface circuit on the gate insulating film; and the step of patterning the first and second gate electrode material layers by using a single mask and forming the gate electrodes of the transistor constituting the internal circuit and the transistor constituting the interface circuit.

The method preferably has the following characteristics:

(h) The gate insulating film of the transistor constituting the interface circuit has a thickness of 5 nm or more and the gate insulating film of the transistor constituting the internal circuit has a thickness of less than 5 nm.

(i) The method further comprises the step of forming element isolating regions at the main surface of the semiconductor substrate before the formation of the oxynitride film.

(j) The method further comprises the step of introducing impurities into the semiconductor substrate and forming a source/drain region after the step of forming the gate electrodes of the transistor constituting the internal circuit and the transistor constituting the interface circuit.

With the manufacturing methods described above, because the gate insulating film and gate electrode material layer of the transistor constituting the first circuit (interface circuit) are formed in processes different from those in which the gate insulating film and gate electrode material layer of the transistor constituting the second circuit (internal circuit) are formed, the gate insulating film of the MOSFET constituting the first circuit is made of a pure oxide film ($SiO_2$), and the gate insulating film of the MOSFET constituting the second circuit is made of an oxynitride film, not only the problem of penetration of boron through the MOSFET constituting the second circuit is avoided, but a decrease in the current driving capability due to the appearance of the interface level in the MOSFET constituting the first circuit is prevented. Therefore, it is possible to form a high-speed semiconductor device.

When the gate insulating film of the MOSFET constituting the first circuit (interface circuit) is formed thicker than 5 nm and the gate insulating film of the MOSFET constituting the second circuit (internal circuit) is formed thinner than 5 nm, this suppresses the problem of deterioration of the characteristic because of the influence of nitrogen and the problem of penetration of boron more effectively.

In addition, when the gate electrode material layer of the MOSFET constituting the first circuit (interface circuit) and the gate electrode material layer of the MOSFET constituting the second circuit (internal circuit) are patterned simultaneously using a single mask, this makes it possible to process the gate electrode of the MOSFET constituting the first circuit and the gate electrode of the MOSFET constituting the second circuit simultaneously, which minimizes the complexity of manufacturing processes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
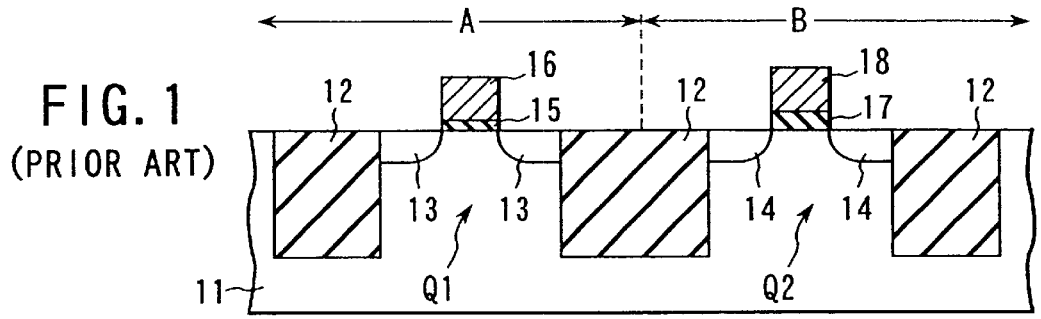
FIG. 1 is a sectional view showing a schematic configuration of a conventional semiconductor device.
Figure 2A:
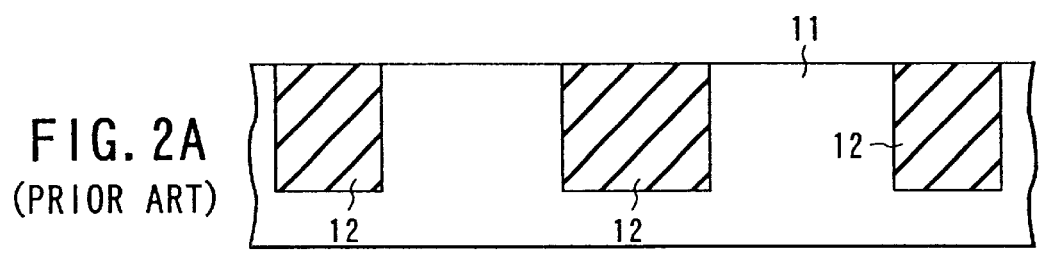
FIGS. 2A to 2D are sectional views of manufacturing steps in sequence to help explain a method of manufacturing a conventional semiconductor device.
Figure 2B:
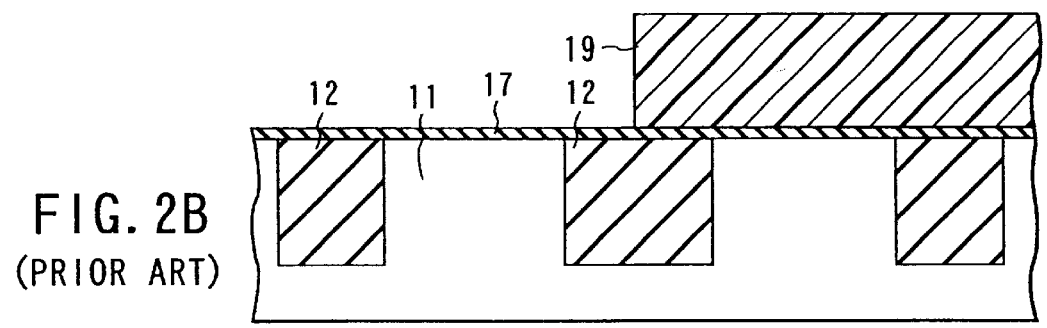
Figure 2C:
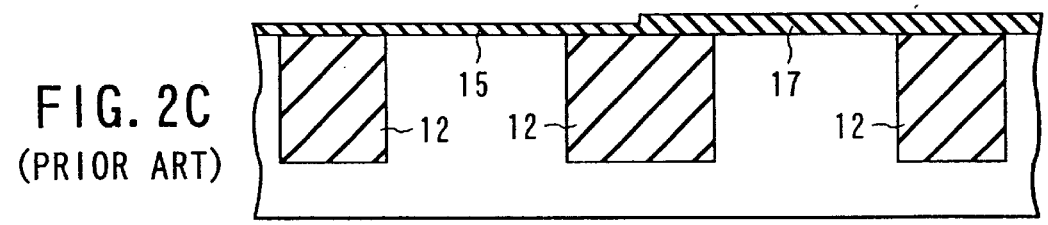
Figure 2D:
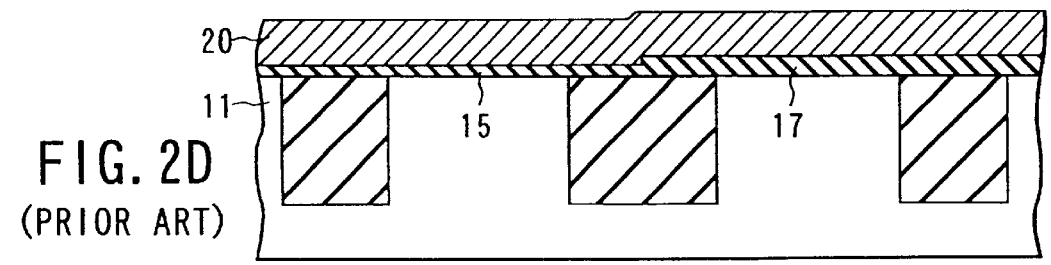
Figure 3:
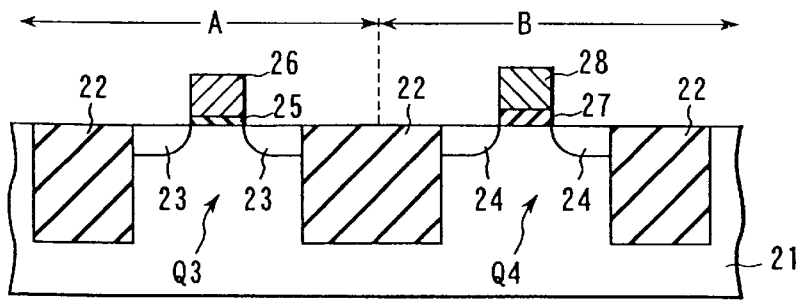
FIG. 3 is a sectional view showing a schematic configuration to help explain a semiconductor device according to an illustrative embodiment of the present invention.

FIG. 3 is a sectional view showing a schematic configuration to help explain a semiconductor device according to an embodiment of the present invention. Area A is for an internal circuit section and area B is for an interface circuit section for exchanging signals and data with, for example, an external device. Both the circuits show a single MOSFET representatively. Actually, however, a large number of MOSFETs are provided and electrically connected to each other.

As shown in FIG. 3, element isolating regions 22 have been formed at the main surface of a silicon (Si) substrate 21. In the element regions electrically separated by the element isolating regions 22, diffused layers acting as source/drain regions 23 and 24 are formed. A gate insulating film 25 is formed on the silicon substrate 21 between the source/drain regions 23. A gate electrode 26 is formed on the gate insulating film 25, thereby constructing a MOSFET Q3 constituting an internal circuit. A gate insulating film 27 is formed on the silicon substrate 21 between the source/drain regions 24. On the gate insulating film 27, a gate electrode 28 is formed, thereby constructing a MOSFET Q4 constituting an interface circuit for exchanging signals and data with an external device.

In the MOSFET Q3 in area A, an oxynitride film of about 4 nm in thickness is used as the gate insulating film 25 and p-type material is used as the gate electrode 26 for a p-channel MOSFET or n-type material is used as the gate electrode 26 for an n-channel MOSFET. The p-type and n-type materials are polysilicon doped with, for example, impurities of the corresponding conductivity type. In the MOSFET Q4 formed in area B, pure $SiO_2$ of about 6 nm thick containing no nitrogen is used for the gate insulating film 27 and polysilicon doped with p-type impurities or n-type impurities is used for the gate electrode 28. The MOSFET Q3 formed in area A operates on a power supply voltage of about 1.8V lower than the voltage on which the MOSFET Q4 formed in area B operates. The dimension (gate length) of the gate electrode is, for example, 180 nm. To provide the optimum performance, the MOSFET with such a dimension requires a gate insulating film of about 4 nm in thickness. When heat treatment (RTA) at about 1000□ in a subsequent process is considered, it is very difficult to realize the gate insulating film 27 using pure $SiO_2$ from the viewpoint of suppressing the diffusion of boron from the p-type gate electrode in the p-channel MOSFET, which makes use of an oxynitride film indispensable.

The MOSFET Q4 in area B is a component element of the circuit for exchanging signals with an external device outside the semiconductor device and operates on a power supply voltage higher than the voltage on which the MOSFET Q3 in area A operates. For example, the gate electrode dimension of the MOSFET Q4 is 250 nm and the gate insulating film is set to a thickness of about 6 nm. The gate insulating film material in the MOSFET Q4 in area B is made of pure $SiO_2$, not oxynitride. When RTA heat treatment at about 1000□ is considered, a gate insulating film with a thickness of about 5 nm or more does not necessarily need an oxynitride film. Even if a p-type gate electrode made of polysilicon doped with boron is used in a p-channel MOSFET, pure $SiO_2$ can be used. Moreover, because oxynitride need not be used in the MOSFET Q4 in area B, the problem of a decrease in the current driving capability due to the interface level caused by an oxynitride film.

As described above, in the present invention, the internal power supply voltage lower than the external power supply voltage is used and an oxynitride film is selectively used as a gate insulating film in the MOSFET Q3 whose insulating film is thinner than that of the MOSFET Q4 using an external power supply voltage. With this configuration, a decrease in the current driving capability of the MOSFET Q4 where a pure oxide film is used as a gate oxide film can be minimized in an LSI using at least two types of power supply voltage, the external power supply voltage and internal power supply voltage.

Specifically, a thick $SiO_2$ film is used as the gate insulating film 17 in the MOSFET Q4 that operates on a high power supply voltage and constitutes the circuit for interfacing with the outside world, and a thin oxynitride film is used as the gate insulating film 15 in the MOSFET Q3 that operates on a low power supply voltage and constitutes the internal circuit. As a result, the characteristic of the MOSFET Q4 never deteriorates because of the effect of nitrogen in the gate insulating film. In addition, the problem of penetration of boron in the MOSFET Q3 can be avoided. Therefore, it is possible to minimize a decrease in the current driving capability and make the operation speed faster in a semiconductor device that requires two or more types of power supply.

As described above, with the configuration of the invention, use of an oxynitride film suppresses the diffusion that starts from the p-type gate electrode and penetrates through the p-type impurity gate insulating film in the MOSFET that is compatible with the internal power supply voltage and uses a thinner gate insulating film; whereas in the MOSFET that is compatible with the external power supply voltage and uses a gate insulating film thicker than that of the MOSFET for the internal power supply voltage, the gate insulating film is made of pure $SiO_2$, not oxynitride. As a result, this provides a structure suitable for a high speed operation without a decrease in the current driving capability due to the appearance of the interface level caused by the oxynitride film.

Next, the processes in a method of manufacturing a semiconductor with the above-described structure will be explained in sequence by reference to FIGS. 4A to 4E.

Figure 4A:
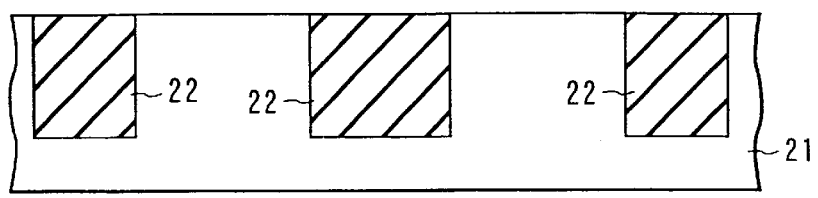
FIGS. 4A to 4E are sectional views of manufacturing steps in sequence to help explain a method of manufacturing a semiconductor device according to the illustrative embodiment of the invention.

First, as shown in FIG. 4A, element isolating regions 22 are formed in specific areas on a silicon substrate 21. Thereafter, specific impurities for controlling the threshold voltage are introduced into the main surface of the silicon substrate 21.

Figure 4B:
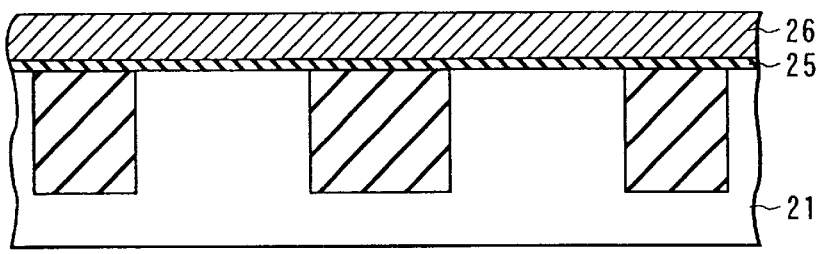

Next, as shown in FIG. 4B, for example, nitriding oxidation is carried out in an atmosphere of $N_2O$, thereby forming an oxynitride film of about 4 nm thick as the gate insulating film 25 of a MOSFET Q3 constituting an internal circuit. Thereafter, polysilicon is deposited to a thickness of, for example, about 200 nm to form the gate electrode 26 of the MOSFET Q3 on the oxynitride film.

Figure 4C:
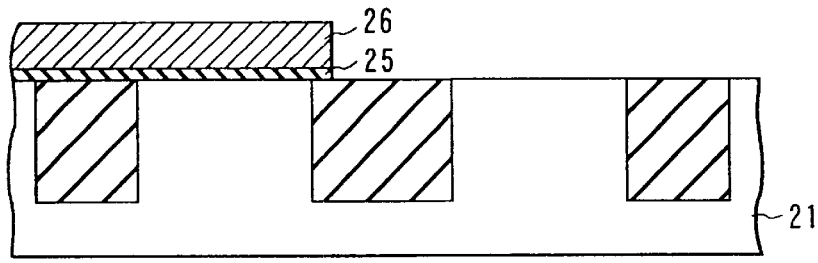

Next, as shown in FIG. 4C, by, for example, photoetching techniques or the like, the oxynitride film and polysilicon are left only in an area (area A in FIG. 3) in which the MOSFET Q3 constituting the internal circuit is to be formed. The polysilicon and the oxynitride film on an area (area B in FIG. 3) in which a MOSFET Q4 constituting an interface circuit for exchanging signals and data with an external device is to be formed are removed in sequence, thereby exposing the surface of the silicon substrate 21.

Figure 4D:
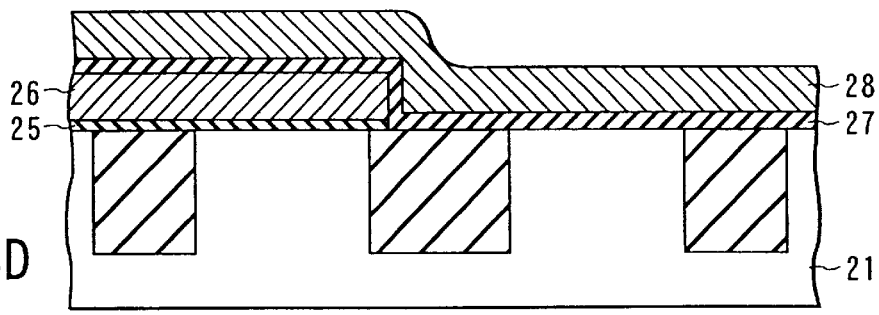
Figure 4E:
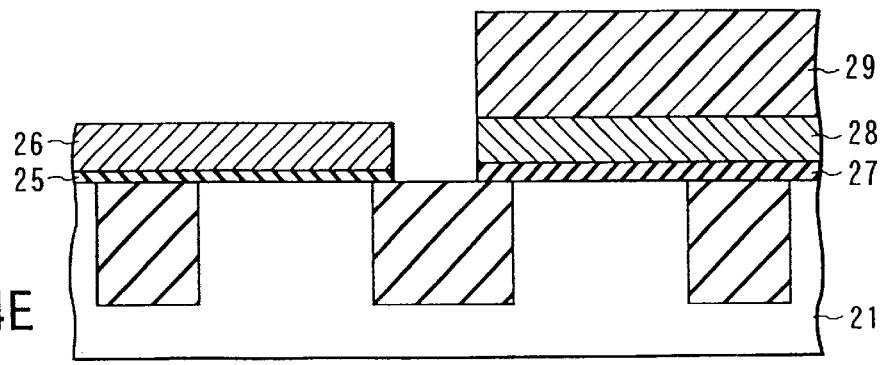

Thereafter, as shown in FIG. 4D, the surface of the exposed silicon substrate 21 is, for example, oxidized thermally, thereby forming a $SiO_2$ film of about 6 nm in thickness as a gate insulating film 27. Namely, the gate insulating film 27 is made of pure $SiO_2$, not oxynitride. Following that, polysilicon is deposited to a thickness of, for example, 200 nm to form a gate electrode 28 on the gate insulating film 27. Then, as shown in FIG. 4E, a resist pattern 29 is formed by photoetching techniques and the polysilicon and the $SiO_2$ film on the area in which the MOSFET Q3 is to be formed are removed in sequence.

Next, polysilicon is patterned by combining the photoetching technique and anisotropic etching and the gate electrodes 26 and 28 are processed simultaneously into a specific shape, with a single mask for each electrode. Thereafter, impurity ions are implanted into the silicon substrate 21. Then, the substrate is subjected to heat treatment (RTA) or the like at about 1000□ for activation, thereby forming a diffused layer to become the source/drain regions 23 and 24 of the individual MOSFETs Q3 and Q4.

With the manufacturing method, the gate insulating film 27 and gate electrode material layer 28 of the MOSFET Q4 constituting the interface circuit for exchanging signals with an external device are formed in different steps from those in which the gate insulating film 25 and gate electrode material layer 26 of the MOSFET Q3 constituting the internal circuit are formed. In addition, the gate insulating film 27 is formed of a pure oxide film ($SiO_2$) and the gate insulating film 25 is made of an oxynitride film. As a result, not only is the problem of penetration of boron from the gate electrode in the MOSFET Q3 avoided, but a decrease in the current driving capability due to the appearance of the interface level in the MOSFET Q4 is prevented. Therefore, it is possible to form a high-speed semiconductor device.

While in the embodiment, the p-type impurities included in the gate electrode of the p-channel MOSFET constituting the internal circuit have been boron, other p-type impurities may be used. For instance, use of $BF_2$ produces a similar effect. When $BF_2$ is used, it is desirable that the thickness of the gate insulating film 27 should be, for example, 6 nm or more.

Figure 5:
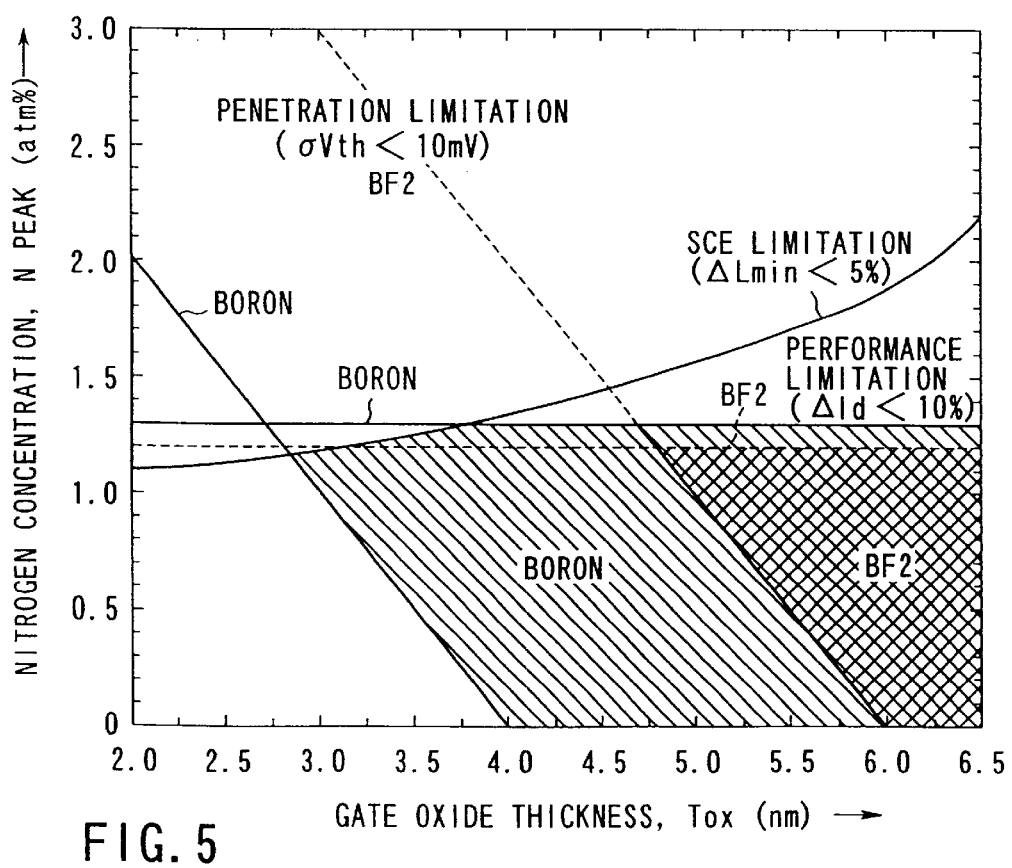
FIG. 5 is a characteristic diagram showing the relationship between the optimized nitrogen concentration and the gate oxide film thickness.

FIG. 5 shows the relationship between the optimized nitrogen concentration and the gate oxide film thickness. In FIG. 5, the horizontal axis indicates the gate oxide film thickness $T_{OX}$ (nm) and the vertical axis indicates the maximum nitrogen concentration $N_{PEAK}$ (atm %) in the nitrogen concentration profile in the direction of depth. The shaded range represents the applicable gate oxide film thickness and nitrogen concentration in a case where boron and $BF_2$ are used as p-type impurities. As can be seen from the figure, it is desirable that, when boron is used, the gate oxide film 25 of 4 nm or less in thickness should be made of an oxynitride film. Additionally, it is preferable that the $N_{PEAK}$ in the oxynitride film is 1.3 atm % or less for boron and 1.2 atm % or less for $BF_2$. The nitrogen concentration $N_{PEAK}$ can be measured easily by SIMS analysis or the like. Normally, the maximum nitrogen concentration $N_{PEAK}$ is sensed in the vicinity of the interface with the substrate.

In the above embodiment, after an oxynitride film to become the gate insulating film of the MOSFET Q3 and polysilicon to become the gate electrode have been formed, an $SiO_2$ film to become the gate insulating film of the MOSFET Q4 and polysilicon to become the gate electrode are formed. Other approaches may be possible. For instance, after an $SiO_2$ film to become the gate insulating film of the MOSFET Q4 and polysilicon to become the gate electrode have been formed, an oxynitride film to become the gate insulating film of the MOSFET Q3 and polysilicon to become the gate electrode may be formed. Furthermore, while in the above embodiment, using a single mask, the polysilicon films 26 and 28 have been processed simultaneously into the gate electrodes of the MOSFETs Q3 and Q4, they may be patterned separately in different processes.

Furthermore, while polysilicon has been used as the material for the gate electrodes of the MOSFETs Q3 and Q4, a stacked structure of polysilicon and at least one of Mo silicide, Ti silicide, W silicide, or Co silicide may be used. In addition, a stacked structure of polysilicon and at least one of metal, such as W, Ti, or Mo, and TiN may be used.

As described above, with the present invention, it is possible to provide a semiconductor device capable of minimizing a decrease in the current driving capability of the MOSFET and making the operation speed of the MOSFET faster in an LSI requiring two or more types of power supply and a method of manufacturing the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device where a first circuit operating on a first voltage and a second circuit operating on a second voltage lower than said first voltage are formed in a single chip and a p-type conductivity material is used for a gate electrode of a p-channel transistor constituting said second circuit, comprising:

forming an oxynitride film of nitrogen-added $SiO_2$ as a gate insulating film of the p-channel transistor constituting said second circuit;

forming a gate electrode material layer of the p-channel transistor constituting said second circuit on said oxynitride film;

forming an $SiO_2$ film as a gate insulating film of a transistor constituting said first circuit; and forming a gate electrode material layer for the transistor constituting said first circuit on said gate insulating film, wherein the gate insulating film and the gate electrode material layer of the transistor constituting said first circuit are formed in processes different from processes in which the gate insulating film and the gate electrode material layer of the p-channel transistor constituting said second circuit are formed.

2. The method of manufacturing a semiconductor device according to claim 1, wherein the gate insulating film of the transistor constituting said first circuit has a thickness of 5 nm or more and the gate insulating film of the p-channel transistor constituting said second circuit has a thickness of less than 5 nm.

3. The method of manufacturing a semiconductor device according to claim 1, further comprising patterning the gate electrode material layer of the transistor constituting said first circuit and the gate electrode material layer of the p-channel transistor constituting said second circuit by using a single mask, wherein a gate electrode of the transistor constituting said first circuit and the gate electrode of the p-channel transistor constituting said second circuit are processed simultaneously.

4. A method of manufacturing a semiconductor device with an interface circuit operating on a first power supply voltage and exchanging signals and data with an external device, and an internal circuit operating on a second power supply voltage lower than said first power supply voltage, comprising:

forming an oxynitride film of nitrogen-added $SiO_2$ as a gate insulating film of a p-channel transistor constituting said internal circuit on a main surface of a semiconductor substrate;

forming a first gate electrode material layer of the p-channel transistor constituting said internal circuit on said oxynitride film;

forming a mask on an area in which said internal circuit is to be formed and removing said oxynitride film and said first gate electrode material layer in an area in which said interface circuit is to be formed to expose the main surface of said semiconductor substrate;

forming an $SiO_2$ film as the gate insulating film of the transistor constituting said interface circuit on the main surface of said exposed semiconductor substrate;

forming a second gate electrode material layer of the transistor constituting said interface circuit on said gate insulating film; and patterning said first and second gate electrode material layers by using a single mask and forming gate electrodes of the p-channel transistor constituting said internal circuit and the transistor constituting said interface circuit.

5. The method of manufacturing a semiconductor device according to claim 4, wherein the gate insulating film of the transistor constituting said interface circuit has a thickness of 5 nm or more and the gate insulating film of the p-channel transistor constituting said internal circuit has a thickness of less than 5 nm.

6. The method of manufacturing a semiconductor device according to claim 4, further comprising forming element isolating regions at the main surface of said semiconductor substrate before forming said oxynitride film.

7. The method of manufacturing a semiconductor device according to claim 4, further comprising introducing impurities into said semiconductor substrate and forming a source/drain region after forming the gate electrodes of the p-channel transistor constituting said internal circuit and the transistor constituting said interface circuit.

* * * * *